United States Patent
Huang et al.

(10) Patent No.: US 10,624,211 B2
(45) Date of Patent: Apr. 14, 2020

(54) MOTHERBOARD WITH DAUGHTER INPUT/OUTPUT BOARD

(71) Applicant: QUANTA COMPUTER INC., Taoyuan (TW)

(72) Inventors: Jen-Hsuen Huang, Taoyuan (TW); Fa-Da Lin, Taoyuan (TW); Pin-Hao Hung, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/108,931

(22) Filed: Aug. 22, 2018

(65) Prior Publication Data
US 2020/0068712 A1 Feb. 27, 2020

(51) Int. Cl.
  H05K 1/00 (2006.01)
  H05K 1/14 (2006.01)
  H05K 3/36 (2006.01)

(52) U.S. Cl.
  CPC ............. *H05K 1/144* (2013.01); *H05K 1/141* (2013.01); *H05K 3/368* (2013.01); *H05K 2201/041* (2013.01)

(58) Field of Classification Search
  CPC .................. H05K 3/3452; H05K 1/144; H01L 2924/3011; H01L 2224/48091
  See application file for complete search history.

(56) References Cited

U.S. PATENT DOCUMENTS

| | | | | |
|---|---|---|---|---|
| 5,161,998 A | * | 11/1992 | Defibaugh | H01R 13/645 439/532 |
| 5,190,480 A | * | 3/1993 | Chau | H01R 13/26 439/567 |
| 5,444,906 A | * | 8/1995 | Korsunsky | H01R 43/205 29/741 |
| 5,572,400 A | | 11/1996 | Roesner et al. | |
| 5,696,669 A | * | 12/1997 | Bassler | G06K 19/077 174/359 |

(Continued)

FOREIGN PATENT DOCUMENTS

| CN | 201489395 U | 5/2010 |
|---|---|---|
| CN | 201490382 U | 5/2010 |

(Continued)

OTHER PUBLICATIONS

Extended European Search Report for EP Application No. 18212243. 2, dated Jun. 4, 2019.

(Continued)

*Primary Examiner* — Pete T Lee
(74) *Attorney, Agent, or Firm* — Nixon Peabody LLP; Zhou Lu

(57) ABSTRACT

The present application discloses a server system. The system includes a chassis, a motherboard installed within the chassis, and a daughterboard installed within the chassis. The motherboard includes one or more central processing unit sockets and one or more memory chip sockets. The daughterboard is communicatively connected to the motherboard. The daughterboard includes one or more input/output (I/O) connectors configured for direct external connections to outside of the chassis. The motherboard has no (I/O) connector configured for direct external connection to outside of the chassis.

16 Claims, 5 Drawing Sheets

(56) References Cited

U.S. PATENT DOCUMENTS

| | | | | |
|---|---|---|---|---|
| 6,166,917 | A * | 12/2000 | Anderson | H05K 7/1418 |
| | | | | 361/752 |
| 7,924,558 | B2 * | 4/2011 | Crippen | H01R 12/83 |
| | | | | 345/419 |
| 9,785,207 | B1 | 10/2017 | Xu et al. | |
| 2003/0112606 | A1 * | 6/2003 | Burghart | G06F 1/184 |
| | | | | 361/736 |
| 2008/0207023 | A1 * | 8/2008 | Tuin | H01R 13/518 |
| | | | | 439/95 |
| 2012/0008292 | A1 * | 1/2012 | Nichols | H05K 7/1461 |
| | | | | 361/756 |
| 2018/0131110 | A1 * | 5/2018 | Brownjohn | H05K 1/141 |

FOREIGN PATENT DOCUMENTS

| | | |
|---|---|---|
| CN | 202331281 U | 7/2012 |
| CN | 202872825 U | 4/2013 |
| CN | 203596014 U | 5/2014 |
| CN | 203838698 U | 9/2014 |
| JP | H11-154036 A | 6/1999 |
| JP | 2003-288134 A | 10/2003 |
| JP | 2010-212287 A | 9/2010 |
| TW | 201325393 A1 | 6/2013 |
| TW | M485441 U | 9/2014 |
| TW | 201643730 A | 12/2016 |
| TW | I626527 B | 6/2018 |

OTHER PUBLICATIONS

TW Office Action for Application No. 107137630, dated Jun. 5, 2019, w/First Office Action Summary.

TW Search Report for Application No. 107137630, dated Jun. 5, 2019, w/First Office Action.

JP Office Action for Application No. 2019-004096, dated Jan. 14, 2020, w/ First Office Action Summary.

* cited by examiner

MOTHERBOARD WITH DAUGHTER INPUT/OUTPUT BOARD

FIELD OF THE INVENTION

The present invention relates to server systems and more specifically, the input/output (I/O) connectors of server systems.

BACKGROUND

Space within a server system is typically limited. Because of the limited space, conventional motherboards for server systems take up to nearly all of the length of the corresponding chassis. The length of conventional motherboards relative to the chassis can cause problems when assembling the server systems. For example, the I/O interface is typically located on the rear side of a server system's conventional motherboard, and therefore makes it difficult to place the conventional motherboard in the chassis of the server system. This is shown in FIG. 1.

FIG. 1 illustrates a conventional server system 100, such as a conventional rackmount server system, and the above-described difficulties. The server system 100 includes a conventional motherboard 102. The conventional motherboard 102 is the main board, and therefore has one or more central processing unit sockets 104 and one or more memory chip sockets 106. The conventional motherboard 102 includes an I/O interface 108 with I/O connectors 110 at its rear edge 102a. The conventional motherboard 102 can be slightly longer than the chassis 112, when factoring in the additional length of the I/O connectors 110. The length of the conventional motherboard 102 is intended to maximize area for components—such as the one or more central processing unit sockets 104, the one or more memory chip sockets 106, and the like—at the expense of assembly issues. For example, FIG. 1 shows how the conventional motherboard 102 must be awkwardly angled relative to the chassis 112, while being inserted into the chassis 112. The awkward angle is required so that the I/O interface 108, with the I/O connectors 110 at the rear of the conventional motherboard 102, can extend through the rear panel 114 of the chassis 112. The awkward angle presents difficulty during assembly and can also cause damage to the conventional motherboard 102. In some instances, one or more indicators (not shown), such as LED indicators, can be between and/or near the I/O connectors 110, and the indicators can be similarly damaged during assembly of the conventional motherboard 102 in the chassis 112.

Additionally, from a serviceability point of view, having the I/O interface 108 integral with the conventional motherboard 102 makes changing the I/O interface 108, or one or more I/O connectors 110 on the I/O interface 108, impossible (or at the very least, difficult). To the extent that the I/O interface 108 or one or more I/O connectors 110 can be changed, such a change requires shutdown of the server system.

Accordingly, there is a need for devices that overcome the foregoing drawbacks.

SUMMARY

The various embodiments concern apparatuses for separating the I/O connectors from the motherboard.

A server system, according to a first embodiment, includes a chassis, a motherboard, and a daughterboard. The motherboard is the main board of the server system. The motherboard includes one or more central processing unit sockets and one or more memory chip sockets. The motherboard has no (I/O) connector configured for direct external connection to outside of the chassis. The daughterboard is communicatively connected to the motherboard. The daughterboard includes one or more input/output (I/O) connectors configured for direct external connections to outside of the chassis.

In some implementations, the motherboard and the daughterboard are communicatively coupled by a hot-pluggable connector. The hot-pluggable connector can be a straight connector or a right-angled connector.

In some implementations, the motherboard, the daughterboard, or a combination thereof include a guide pin. For example, the daughterboard can include the guide pin.

In some implementations, the I/O connectors include one or more of a video connector, a parallel port connector, a serial port connector, a network interface controller (NIC) connector, and/or universal serial bus (USB) connector.

In some implementations, the daughterboard has all of the I/O connectors for the server system.

In some implementations, the chassis includes a front panel and a rear panel, and the one or more I/O connectors extend through one or more apertures in the rear panel.

In some implementations, the chassis includes a front panel and a rear panel, and the one or more I/O connectors are flush with one or more apertures in the rear panel In some implementations, the chassis includes a front panel and a rear panel, and the one or more I/O connectors are recessed within the chassis, relative to one or more apertures in the rear panel.

In some implementations, a length of the motherboard is about 90% or less than a length of the chassis.

In some implementations, the chassis has no external apertures aligned with a connector of the motherboard.

A board system, according to a second embodiment, includes a motherboard with one or more central processing unit sockets and one or more memory chip sockets. The motherboard has no (I/O) connectors configured for direct external connection with the board system installed within a chassis. The board system also includes a daughterboard communicatively connected to the motherboard via a board connector. The daughterboard has one or more input/output (I/O) connectors configured for direct external connections with the board system installed within a chassis.

In some implementations, the board connector is a hot-pluggable connector. The board connector can also be a straight connector or a right-angled connector.

In some implementations, the motherboard, the daughterboard, or a combination thereof, includes a guide pin. For example, the daughterboard can include the guide pin.

In some implementations, the I/O connectors include one or more of a video connector, a parallel port connector, a serial port connector, a network interface controller (NIC) connector, and/or universal serial bus (USB) connector.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

Figure 1:
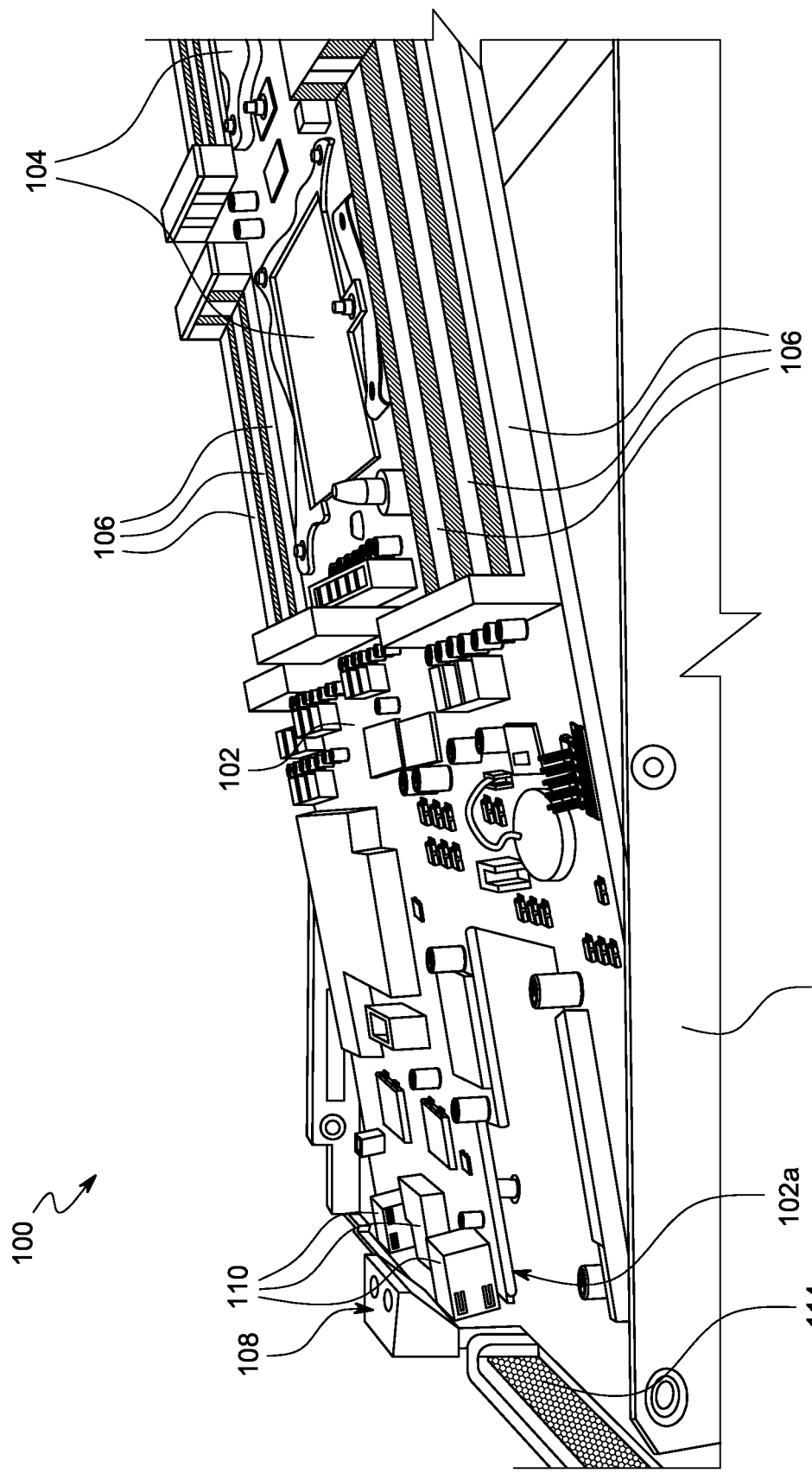
FIG. 1 illustrates a view of a conventional motherboard that is useful for describing the various embodiments.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events.

To that extent, elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

As noted above with respect to FIG. 1, the rear side of a conventional motherboard is a common placement configuration for I/O connectors in conventional motherboard design. Although this kind of placement is common, the placement causes assembly issues because of the length of conventional motherboards for server systems relative to the chassis. The I/O connectors need to fit in the rear panel of the chassis during assembly. Thus, the first step of assembly is to arrange the conventional motherboard in an awkward angle to fit the I/O connectors in the rear panel of the chassis.

To alleviate the foregoing challenges, embodiments of the present invention involve removing the I/O connectors from the motherboard. By removing the I/O connectors from the motherboard, the motherboard can be assembled within the chassis without having to awkwardly angle the motherboard. The removed I/O connectors are instead placed off the motherboard on a separate daughterboard that is coupled with the motherboard.

Figure 2A:
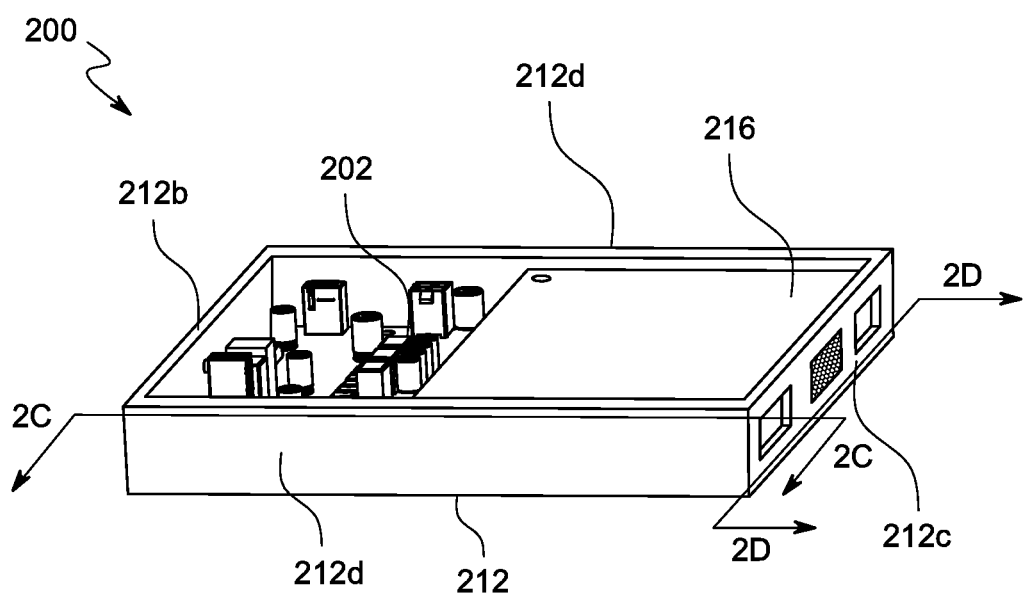
FIG. 2A illustrates a perspective view of a server system, according to aspects of the present disclosure.
Figure 2B:
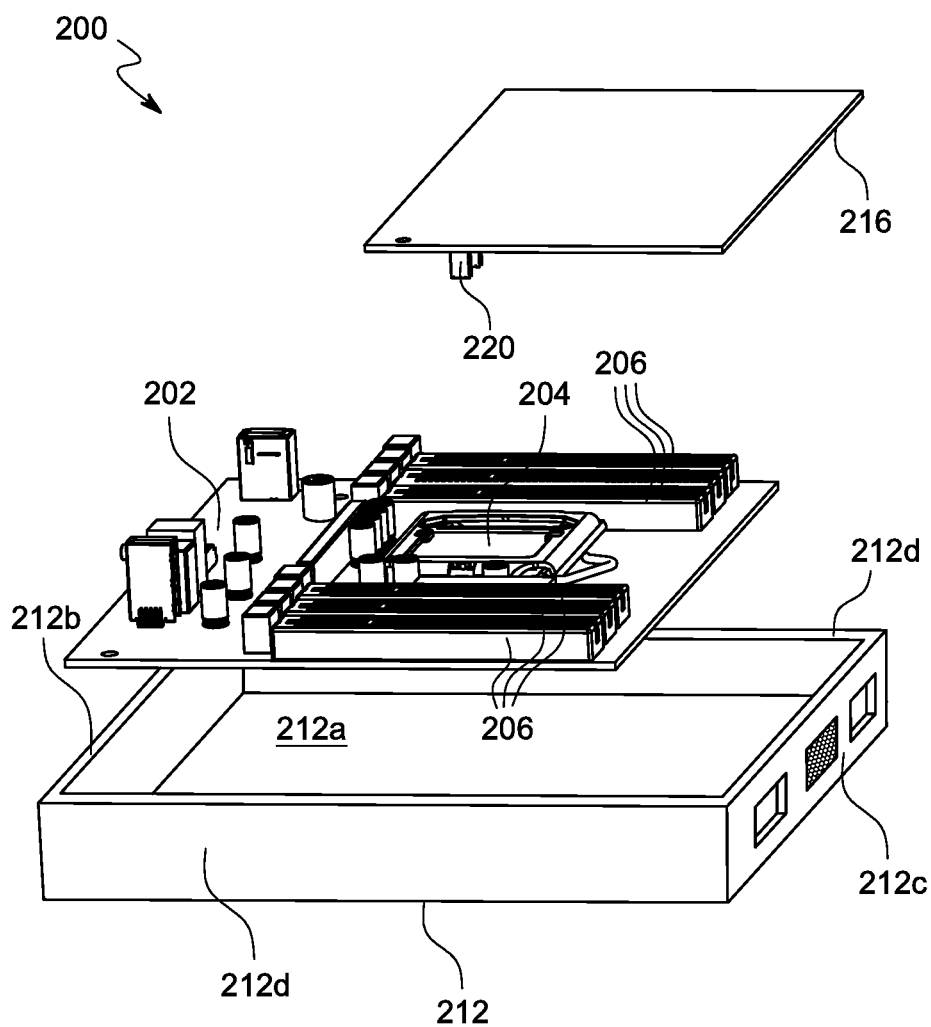
FIG. 2B illustrates an exploded view of the server system of FIG. 2A, according to aspects of the present disclosure.
Figure 2C:
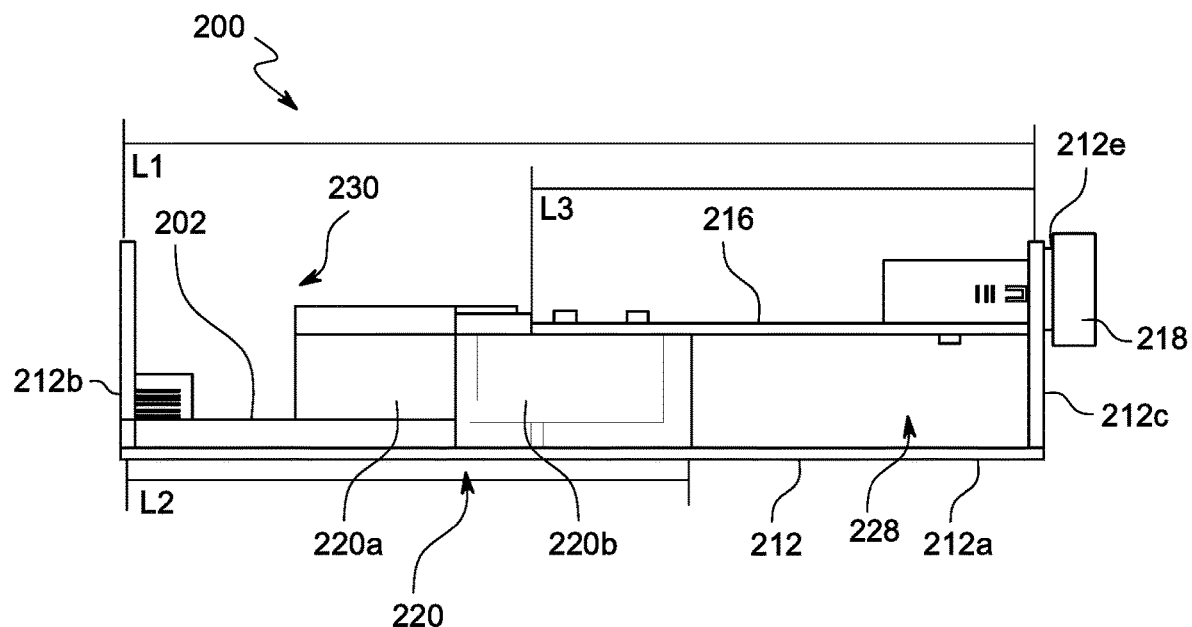
FIG. 2C illustrates a cross-sectional view of the server system along the line 2C-2C of FIG. 2A, according to aspects of the present disclosure.
Figure 2D:
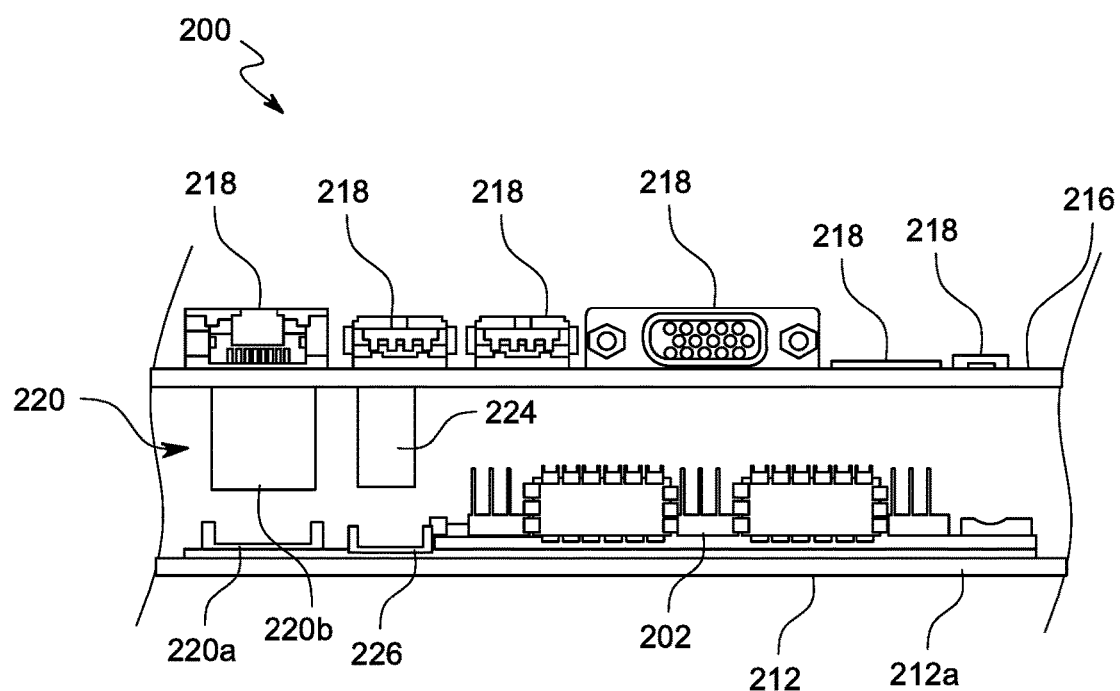
FIG. 2D illustrates a rear view of the server system along the line 2D-2D of FIG. 2A, according to aspects of the present disclosure.

FIGS. 2A-2D illustrate a server system 200 with a motherboard 202 and a daughterboard 216, according to the present disclosure. Specifically, FIG. 2A illustrates a perspective view of the server system 200, according to aspects of the present disclosure. FIG. 2B illustrates an exploded view of the server system 200, according to aspects of the present disclosure. FIG. 2C illustrates a cross-sectional view of the server system 200 along the line 2C-2C of FIG. 2A, according to aspects of the present disclosure. FIG. 2D illustrates a rear view of the server system 200 along the line 2D-2D of FIG. 2A, according to aspects of the present disclosure.

Referring to FIGS. 2A and 2B, the server system 200 includes the motherboard 202 and the daughterboard 216 assembled within a chassis 212. The chassis 212 can be any type of conventional server chassis, such as a rackmount chassis within a blade server system. The chassis 212 includes a bottom panel 212a, to which at least the motherboard 202 is connected, a front panel 212b, and a rear panel 212c. The chassis 212 can also include side panels 212d. The rear panel 212c can have one or more apertures 212e to expose for I/O connectors 218 (discussed below). As shown in FIG. 2C, the length of the chassis 212 is L1.

The motherboard 202 is the main board of the server system 200. The motherboard 202 includes one or more central processing unit sockets 204 (for one or more central processing units) and one or more memory chip sockets 206 (for one or more memory chips). The motherboard 202 can include various other components of a conventional motherboard; however, the motherboard 202 does not have any I/O connector configured for direct external connection to outside of the chassis 212. Because the motherboard 202 does not have any I/O connector configured for direct external connection to outside of the chassis 212, the chassis 212 does not have any aperture that is aligned with a connector of the motherboard 202. Because the motherboard 202 does not have any I/O connector configured for direct external connection to outside of the chassis 212, the motherboard 202 can be shorter in length than conventional motherboards. By being shorter in length, the length L2 (FIG. 2C) of the motherboard, compared to the length L1 (FIG. 2C) of the chassis 212, allows the motherboard 202 to be dropped straight into the chassis 212 during assembly. For example, the length L2 of the motherboard can be about 95%, about 90%, about 80%, about 70%, about 60%, about 50%, or less than about 50% of the length L1 of the chassis. Being able to drop the motherboard 202 straight into the chassis 212 during assembly eliminates the awkward angle required for assembly of computer systems with conventional motherboards, such as the motherboard 102 described above, and the associated issues.

In one or more embodiments, the motherboard 202 can be the same length as a conventional motherboard 102 (FIG. 1), except for the additional length added by the I/O connectors 110 on the conventional motherboard 102. Without the additional length of the I/O connectors 110, and without the need to have I/O connectors extend beyond the chassis, the length L2 of the motherboard 202 can be substantially the same length L1 as the interior of the chassis 212. Yet, the motherboard 202 can still be dropped straight down into the chassis 212.

The daughterboard 216 communicatively connects to the motherboard 202 and includes I/O connectors 218. The I/O connectors 218 are configured for direct external connection of the server system 200 to outside of the chassis 212. In one or more embodiments, the daughterboard 216 has all of the I/O connectors 218 for direct external connection to outside of the server system 200. In one or more embodiments, the daughterboard 216 has all of the I/O connectors 218 to outside of the server system 200. With the daughterboard 216 installed within the chassis 212, the I/O connectors align with the apertures 212e in the rear panel 212c of the chassis 212. As shown in FIG. 2C, the I/O connectors 218 can extend beyond the rear panel 212c of the chassis 212. Alternatively, the I/O connectors 218 can be flush with the rear panel 212c, or even recessed within the chassis 212 relative to the rear panel 212c.

In one or more embodiments, the daughterboard 216 can be secured within the chassis 212 by being coupled to the motherboard 202, to the chassis 212 directly, or both. For example, the daughterboard 216 can be coupled to the bottom panel 212a or to the rear panel 212c, or both, using any type of mechanical fastener. In one or more specific embodiments, the daughterboard 216 can include a bracket or panel (not shown) and assists in couple the daughterboard 216 to the bottom panel 212a, the rear panel 212c, or both.

Similar to the motherboard 202, the length of the daughterboard 216 allows the daughterboard 216 to be dropped straight down into the chassis 212. In one or more embodiments, once the daughterboard 216 is dropped straight into the chassis 212, the daughterboard 216 can be slid horizontally so that the I/O connectors 218 are positioned appropriately relative to the rear panel 212c of the chassis 212, as described above. Alternatively, the I/O connectors 218 can be in the desired positioned simply by dropping the daughterboard 216 into the chassis 212, such as when the I/O connectors 218 are recessed relative to the rear panel 212c of the chassis 212.

The I/O connectors 218 can be any type of I/O connector found within a server system. For example, the I/O connectors 218 can include one or more video connectors, one or more parallel port connectors, one or more serial port connectors, one or more network interface controller (NIC) connectors, one or more universal serial bus (USB) connectors, or any combination thereof.

The motherboard 202 and the daughterboard 216 are communicatively connected through one or more board connectors. As illustrated in FIGS. 2B and 2C, the motherboard 202 is connected to the daughterboard 216 by the board connector 220. The daughterboard 216 can include the male portion 220a of the board connector 220, and the motherboard 202 can include the corresponding female portion 220b of the board connector 220. Alternatively, the motherboard 202 can include the male portion 220a, and the daughterboard 216 can include the corresponding female portion 220b.

The board connector 220 can be any type of board connector. For example, the board connector can be any board-to-board connector, such as a board-to-board connector used on the backplane board interconnection for server, networking, and storage applications. The board connector 220 can be configured for high speed signals. When the board connector 220 is configured for high speed signals, a loss compensator can be included. In one or more embodiments, the board connector 220 can be a hot-pluggable connector. The board connector 220 configured as a hot-pluggable connector allows the daughterboard 216 to be swapped with another daughterboard 216 without having to shut down the server system 200.

In one or more embodiments, the board connector 220 can be configured as a straight board connector. As a straight board connector, the connection between the motherboard 202 and the daughterboard 216 is established by pressing the daughterboard 216 down towards the motherboard 202. Alternatively, the board connector 220 can be a right-angled board connector. As a right-angled board connector, the connection between the motherboard 202 and the daughterboard 216 is established by sliding the daughterboard 216 horizontally relative to the motherboard 202. Such a connection is convenient for sliding the I/O connectors 218 through the rear panel 212c of the chassis 212 during connection of the motherboard 202 with the daughterboard 216. This type of connector also further eliminates any need to angle the daughterboard 216 relative to the chassis 212 during assembly. This type of board connector 220 is also only possible by having the length L3 of the daughterboard 216 be less than the length L1 of the chassis 212.

Figure 2E:
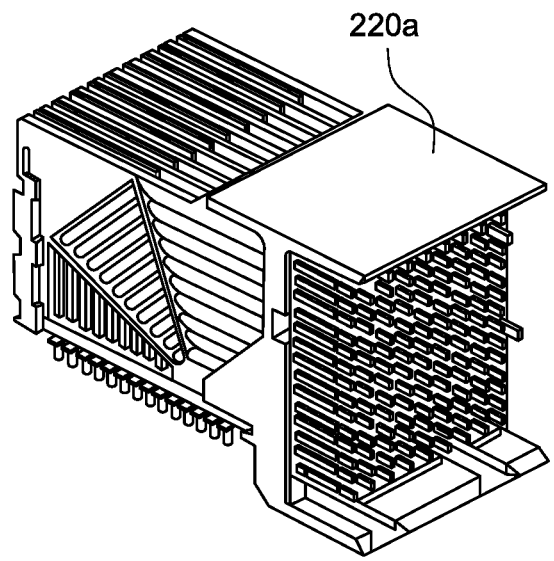
FIG. 2E illustrates an example male right-angled connector 220, according to aspects of the present disclosure.
Figure 2F:
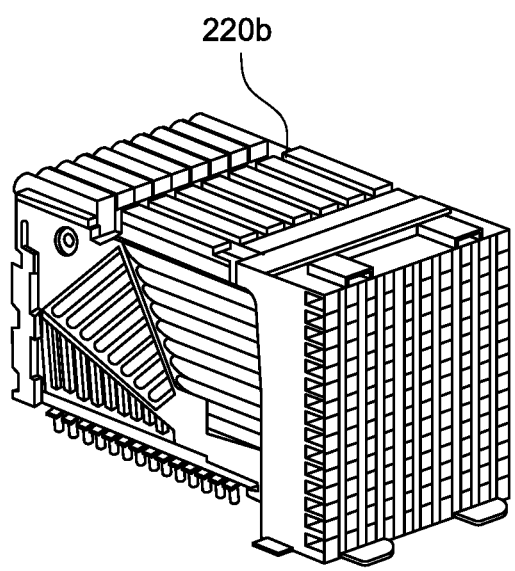
FIG. 2F illustrates an example corresponding female right-angled interface, according to aspects of the present disclosure.

FIG. 2E illustrates an example male portion 220a of a right-angled board connector, and FIG. 2F illustrates an example corresponding female portion 220b of a right-angled board connector. More specifically the board connector formed by the male portion 220a and the female portion 220b of FIGS. 2E and 2F, respectively, can be an AirMax connector from Amphenol ICC.

The motherboard 202, the daughterboard 216, or both can have one or more guide pins to aid in lining up the motherboard 202 with the daughterboard 216 during assembly. For example, FIG. 2D illustrates an embodiment wherein the daughterboard 216 includes a guide pin 224, and the motherboard 202 includes a corresponding socket 226. Alternatively, the daughterboard 216 can include the socket 226 and the motherboard 202 can include the guide pin 224. FIG. 2D also illustrates the various I/O connectors 218 on the daughterboard 216 above the motherboard 202.

Referring back to FIG. 2C, in one or more embodiments, the area 228 below the daughterboard 216 and/or the area 230 above the motherboard 202 can be used for one or more additional components within the system 200. For example, an open compute project (OCP) card can be within the area 228, and a baseboard management controller (BMC), a complex programmable logic device (CPLD), or another component can be within the area 230.

In one or more embodiments, the I/O pins can be optimized. One optimization can include distinguishing the I/O pins according to power signals, buses (e.g., SMbus, Ethernet, USB, etc.), or sideband signals. The I/O pins can then be arranged to share ground pins for minimizing pin counts and printed circuit board (PCB) routing. The number of pin counts for sideband signals can be minimized to use fewer pins to get the same function.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a", "an," and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A server system comprising:
a chassis having a bottom panel and a connection panel;
a motherboard installed within the chassis and secured to the bottom panel, the motherboard comprising one or more central processing unit sockets and one or more memory chip sockets;
an additional component coupled to the motherboard; and
a daughterboard installed within the chassis and communicatively connected to the motherboard, the daughterboard comprising one or more input/output (I/O) connectors configured for direct external connections to outside of the chassis, the one or more I/O connectors mounted on the daughterboard and being operable to slide through the connection panel of the chassis from within the chassis during installation of the daughterboard to expose the one or more I/O connectors for external connection, and,
wherein the motherboard has no (I/O) connector configured for direct external connection to outside of the chassis; wherein the motherboard is spaced apart from the connection panel by a gap, wherein a first portion of the daughterboard extends over the motherboard, wherein a second portion of the daughterboard extends over the gap between the motherboard and the connection panel when installed in the chassis; and wherein the additional component is positioned within the gap between the motherboard and the connection panel.

2. The server system of claim 1, wherein the motherboard and the daughterboard are communicatively coupled by a hot-pluggable connector.

3. The server system of claim 2, wherein the hot-pluggable connector is a straight connector.

4. The server system of claim 2, wherein the hot-pluggable connector is a right-angled connector.

5. The server system of claim 1, wherein the motherboard, the daughterboard, or a combination thereof include a guide pin.

6. The server system of claim 1, wherein the I/O connectors comprise one or more of a video connector, a parallel port connector, a serial port connector, a network interface controller (NIC) connector, and/or a universal serial bus (USB) connector.

7. The server system of claim 1, wherein the chassis includes a front panel and a rear panel, and wherein the one or more I/O connectors extend through one or more apertures in the rear panel.

8. The server system of claim 1, wherein the chassis includes a front panel and a rear panel, and wherein the one or more I/O connectors are flush with one or more apertures in the rear panel.

9. The server system of claim 1, wherein the chassis has no external apertures aligned with a connector of the motherboard.

10. The server system of claim 1, wherein the daughterboard has all of the I/O connectors for the server system.

11. A board system comprising:
a motherboard comprising one or more central processing unit sockets and one or more memory chip sockets, the motherboard installable on a bottom panel of a chassis;
an additional component coupled to the motherboard; and
a daughterboard communicatively connected to the motherboard via a board connector, the daughterboard comprising one or more input/output (I/O) connectors configured for direct external connections with the board system installed within the chassis, the one or more I/O connectors mounted on the daughterboard and being operable to slide through a connection panel of the chassis from within the chassis during installation of the daughterboard to expose the one or more I/O connectors for external connection with the board system,
wherein the motherboard has no (I/O) connector configured for direct external connection with the board system installed within the chassis, wherein the motherboard has an edge facing the connection panel of the chassis when installed in the chassis, wherein a first portion of the daughterboard extends over the motherboard, wherein a second portion of the daughterboard extends over a gap between the edge of the motherboard and the connection panel when installed in the chassis, and wherein the additional component is positioned within the gap between the edge of the motherboard and the connection panel.

12. The board of claim 11, wherein the board connector is a hot-pluggable connector.

13. The board system of claim 12, wherein the hot-pluggable connector is a straight connector.

14. The board system of claim 12, wherein the hot-pluggable connector is a right-angled connector.

15. The board system of claim 11, wherein the motherboard, the daughterboard, or a combination thereof include a guide pin.

16. The board system of claim 11, wherein the I/O connectors comprise one or more of a video connector, a parallel port connector, a serial port connector, a network interface controller (NIC) connector, and/or universal serial bus (USB) connector.

* * * * *